United States Patent
Kim et al.

(10) Patent No.: US 12,146,920 B2
(45) Date of Patent: Nov. 19, 2024

(54) SYSTEM AND METHOD FOR DIAGNOSING BATTERY

(71) Applicants: Hyundai Motor Company, Seoul (KR); Kia Corporation, Seoul (KR)

(72) Inventors: Woo Sung Kim, Hwaseong-si (KR); Ki Seung Baek, Hwaseong-si (KR); Sung Il Lee, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 0 days.

(21) Appl. No.: 17/518,986

(22) Filed: Nov. 4, 2021

(65) Prior Publication Data
US 2022/0146583 A1 May 12, 2022

Related U.S. Application Data

(60) Provisional application No. 63/110,744, filed on Nov. 6, 2020.

(51) Int. Cl.
*G01R 31/389* (2019.01)
*B60L 3/00* (2019.01)
(Continued)

(52) U.S. Cl.
CPC .......... *G01R 31/389* (2019.01); *B60L 3/0046* (2013.01); *B60L 50/60* (2019.02); *B60L 58/10* (2019.02); *B60L 58/12* (2019.02); *B60L 58/16* (2019.02); *B60L 58/21* (2019.02); *G01R 31/367* (2019.01); *G01R 31/3835* (2019.01); *G01R 31/3842* (2019.01); *G01R 31/392* (2019.01);
(Continued)

(58) Field of Classification Search
CPC ................ G01R 31/389; G01R 31/367; G01R 31/3842; G01R 31/392; G05B 23/0218; G05B 23/0256
See application file for complete search history.

(56) References Cited

U.S. PATENT DOCUMENTS

| 7,154,247 B2 | 12/2006 | Kikuchi et al. |
| 7,456,612 B2 | 11/2008 | Murakami |

(Continued)

FOREIGN PATENT DOCUMENTS

| CA | 2 851 503 A1 | 4/2013 | |
| CN | 103229346 A * | 7/2013 | ........... G01R 31/389 |

(Continued)

OTHER PUBLICATIONS

Machine translation for JP 2007085772 A, downloaded Dec. 2022 (Year: 2022).*

(Continued)

*Primary Examiner* — John C Kuan
(74) *Attorney, Agent, or Firm* — Morgan, Lewis & Bockius LLP

(57) ABSTRACT

The present disclosure relates to a battery diagnosis system including a processor configured to: receive high-voltage battery information of a parked car; measure impedance of a battery through the received battery information; and determine, based on a comparison between a normal battery impedance and an abnormal battery impedance, that a battery having an abnormal battery impedance is an abnormal battery.

13 Claims, 3 Drawing Sheets

(51) Int. Cl.
| | |
|---|---|
| *B60L 50/60* | (2019.01) |
| *B60L 58/10* | (2019.01) |
| *B60L 58/12* | (2019.01) |
| *B60L 58/16* | (2019.01) |
| *B60L 58/21* | (2019.01) |
| *G01R 31/367* | (2019.01) |
| *G01R 31/3835* | (2019.01) |
| *G01R 31/3842* | (2019.01) |
| *G01R 31/392* | (2019.01) |
| *G05B 23/02* | (2006.01) |
| *G07C 5/00* | (2006.01) |
| *G07C 5/08* | (2006.01) |
| *H01M 10/42* | (2006.01) |
| *H01M 10/48* | (2006.01) |

(52) U.S. Cl.
CPC ......... *G07C 5/008* (2013.01); *G07C 5/0825* (2013.01); *H01M 10/425* (2013.01); *H01M 10/482* (2013.01); *H01M 10/486* (2013.01); *B60L 2240/545* (2013.01); *B60L 2240/547* (2013.01); *G05B 23/0218* (2013.01); *G05B 23/0256* (2013.01); *H01M 2010/4271* (2013.01); *H01M 2220/20* (2013.01)

(56) References Cited

U.S. PATENT DOCUMENTS

| | | | |
|---|---|---|---|
| 7,589,492 B2 | 9/2009 | Ooishi et al. | |
| 7,821,234 B2 | 10/2010 | Moriya | |
| 7,893,652 B2 | 2/2011 | Suzuki et al. | |
| 7,990,109 B2 | 8/2011 | White et al. | |
| 8,000,915 B2 | 8/2011 | Furukawa et al. | |
| 8,219,333 B2 | 7/2012 | Li | |
| 8,878,493 B2 | 11/2014 | Kobayashi | |
| 9,461,320 B2 | 10/2016 | Ballantine et al. | |
| 9,465,084 B2 | 10/2016 | Park | |
| 9,577,458 B2 | 2/2017 | Kaita et al. | |
| 9,720,047 B2 | 8/2017 | Joe | |
| 10,132,868 B2 | 11/2018 | Sun et al. | |
| 10,261,136 B2 | 4/2019 | Hosaka et al. | |
| 10,830,829 B2 | 11/2020 | Gelso et al. | |
| 11,316,352 B2 | 4/2022 | Hale | |
| 11,691,518 B2 | 7/2023 | Holme | |
| 2006/0186890 A1* | 8/2006 | Iwane | G01R 31/392 324/426 |
| 2007/0052424 A1* | 3/2007 | Okumura | G01R 31/396 324/432 |
| 2010/0224157 A1 | 9/2010 | Mizuno | |
| 2011/0006731 A1 | 1/2011 | Wang et al. | |
| 2012/0019253 A1* | 1/2012 | Ziegler | H01M 10/48 324/433 |
| 2012/0112703 A1 | 5/2012 | Xu et al. | |
| 2013/0141109 A1* | 6/2013 | Love | G01R 31/389 324/430 |
| 2013/0342212 A1* | 12/2013 | Kawahira | G01R 31/392 324/433 |
| 2014/0159738 A1 | 6/2014 | Jeong et al. | |
| 2014/0218042 A1* | 8/2014 | Koba | G01R 31/367 324/430 |
| 2014/0333315 A1 | 11/2014 | Yamamoto | |
| 2015/0228990 A1 | 8/2015 | Ballantine et al. | |
| 2015/0288197 A1* | 10/2015 | Choi | G01R 31/392 320/137 |
| 2016/0069963 A1* | 3/2016 | Hebiguchi | G01R 31/392 324/430 |
| 2017/0018823 A1 | 1/2017 | Kwon | |
| 2017/0160327 A1 | 6/2017 | Jung et al. | |
| 2017/0279164 A1 | 9/2017 | Herrema et al. | |
| 2018/0062210 A1 | 3/2018 | Kim | |
| 2018/0106869 A1 | 4/2018 | Gelso et al. | |
| 2019/0146040 A1 | 5/2019 | Murakami et al. | |
| 2020/0072909 A1* | 3/2020 | Soejima | G01R 31/392 |
| 2020/0096572 A1 | 3/2020 | You et al. | |
| 2020/0158784 A1 | 5/2020 | Fabregas et al. | |
| 2020/0326378 A1 | 10/2020 | Oono et al. | |
| 2020/0391610 A1 | 12/2020 | Park et al. | |
| 2020/0412153 A1 | 12/2020 | Matsumura et al. | |
| 2021/0231743 A1* | 7/2021 | Christophersen | G01R 31/396 |
| 2022/0111759 A1* | 4/2022 | Ijaz | B60L 53/16 |
| 2022/0149630 A1 | 5/2022 | Burchardt | |

FOREIGN PATENT DOCUMENTS

| | | | |
|---|---|---|---|
| CN | 203909253 U | 10/2014 | |
| CN | 106772099 A * | 5/2017 | G01R 31/36 |
| DE | 102015203878 A1 * | 9/2016 | |
| DE | 102019110349 A1 * | 10/2020 | |
| EP | 0 438 477 B1 | 9/1995 | |
| EP | 1 316 458 A1 | 6/2003 | |
| EP | 1 846 776 A1 | 10/2007 | |
| EP | 1 919 059 A2 | 5/2008 | |
| EP | 2 403 105 A2 | 1/2012 | |
| EP | 4 095 957 A1 | 11/2022 | |
| FR | 3 029 299 A1 | 6/2016 | |
| JP | 200-2008733 A | 1/2002 | |
| JP | 2002-084666 A | 3/2002 | |
| JP | 2004-328902 A | 11/2004 | |
| JP | 2006292565 * | 10/2006 | |
| JP | 2007085772 A * | 4/2007 | G01R 31/3679 |
| JP | 2007-292666 A | 11/2007 | |
| JP | 2007333494 A * | 12/2007 | |
| JP | 2009-190690 A | 8/2009 | |
| JP | 4919120 B2 | 4/2012 | |
| JP | 2013083522 A * | 5/2013 | |
| JP | 2014134467 A * | 7/2014 | |
| JP | 2018181430 A * | 11/2018 | |
| JP | 6566425 B2 | 8/2019 | |
| KR | 20080074240 A * | 8/2008 | |
| KR | 10-2012-0016993 A | 2/2012 | |
| KR | 10-2013-0061964 A | 6/2013 | |
| KR | 10-2013-0075379 A | 7/2013 | |
| KR | 10-2014-0075983 A | 6/2014 | |
| KR | 10-2014-0093122 A | 7/2014 | |
| KR | 10-2014-0122520 A | 10/2014 | |
| KR | 10-2015-0052384 A | 5/2015 | |
| KR | 10-1558696 B1 | 10/2015 | |
| KR | 10-1755910 B1 | 7/2017 | |
| KR | 20170109435 A * | 9/2017 | |
| KR | 10-1818515 B1 | 1/2018 | |
| KR | 10-2018-0056091 A | 5/2018 | |
| KR | 20180067140 A * | 6/2018 | |
| KR | 10-1942707 B1 | 1/2019 | |
| KR | 10-1955537 B1 | 3/2019 | |
| KR | 10-2017573 B1 | 9/2019 | |
| KR | 10-2020-0022639 A | 3/2020 | |
| KR | 20200038005 A * | 4/2020 | |
| KR | 10-2020-0143019 A | 12/2020 | |
| KR | 10-2229019 B1 | 3/2021 | |
| KR | 10-2022-0006270 A | 2/2022 | |
| KR | 10-2022-0012483 A | 2/2022 | |
| KR | 10-2022-0060083 A | 5/2022 | |
| TW | I404644 B | 8/2013 | |
| WO | 2006/082425 A1 | 8/2006 | |
| WO | 2015/123304 A1 | 8/2015 | |
| WO | 2016/071801 A1 | 5/2016 | |
| WO | 2016/147326 A1 | 9/2016 | |
| WO | 2019/008367 A1 | 1/2019 | |

OTHER PUBLICATIONS

Koch et al., "Electrochemical Impedance Spectroscopy for Online Battery Monitoring—Power Electronics Control" 2014 16th European Conference on Power Electronics and Applications, 2014 (Year: 2014).*

Christensen et al., "Using on-board Electrochemical Impedance Spectroscopy in Battery Management Systems" EVS27 Barcelona, Spain, Nov. 17-20, 2013 (Year: 2013).*

Takeno et al., "Quick testing of batteries in lithium-ion battery packs with impedance-measuring technology" Journal of Power Sources 128 (2004) 67-75 (Year: 2004).*

(56) References Cited

OTHER PUBLICATIONS

Machine translation of KR-20180067140-A (Year: 2024).*
Office Action issued on Jun. 17, 2024 in corresponding U.S. Appl. No. 17/520,065.
U.S. Office Action issued on Jul. 11, 2024 in U.S. Appl. No. 17/518,991.
Office Action issued on Sep. 25, 2024 in U.S. Appl. No. 17/520,007.
Office Action issued on Jul. 19, 2024 in U.S. Appl. No. 17/520,013.

* cited by examiner

<Impedance model of battery>

<Impedance characteristic of abnormal battery>

<Impedance characteristic according to battery deterioration>

SYSTEM AND METHOD FOR DIAGNOSING BATTERY

CROSS-REFERENCE TO RELATED APPLICATION

This application is a non-provisional patent application of the provisional patent application No. 63/110,744 filed on Nov. 6, 2020, the disclosures of which are incorporated herein by reference in their entirety.

TECHNICAL FIELD

The present disclosure relates to a battery diagnosis system and, more specifically, to a system and a method for diagnosing a failure of a high-voltage battery during parking by using electrochemical characteristics, wherein the battery of a parked vehicle is simply diagnosed by using a sensor measurement value such that any undetectable defect of the battery is detected through an electrochemical technique, thereby pre-diagnosing a potential battery malfunction.

BACKGROUND

A high-voltage battery refers to a high-output large-capacity battery system and is basically an energy source configured to drive a motor for traveling. As the high-voltage battery is used over time, the impedance of the battery and the degree of deterioration of the battery increase. Such an increased degree of deterioration of the battery decreases the lifespan thereof. Therefore, there is a need for a scheme for diagnosing any failure of the battery for the purpose of safety.

A conventional high-voltage battery failure diagnosis system detects any defect of a high-voltage battery by using the insulation resistance and the cell voltage difference of an unloaded high-voltage battery system in a monitoring step during parking.

In such a high-voltage battery diagnosis system, values and conditions configured to diagnose a failure of a high-voltage battery are not enough to detect a defect which may be fatal to the system, and there is a problem in that battery characteristics (current/voltage/temperature), which are measured in the battery diagnosis system, alone fail to reflect detailed characteristics of the actual battery interior.

An electrochemical impedance spectroscopy refers to a method for applying weak AC signals having different frequencies to a cell and measuring the impedance thereof. By employing such a method using electrochemical characteristics (for example, electrochemical impedance spectroscopy), high-voltage battery failures are to be diagnosed so as to reflect detailed characteristics of the actual battery interior.

The above descriptions regarding background technologies have been made only to help understanding of the background of the present disclosure, and are not to be deemed by those skilled in the art to correspond to already-known prior arts.

SUMMARY

It is an aspect of the present disclosure to provide a method wherein a battery of a parked vehicle is simply diagnosed by using a sensor measurement value so as to detect any undetectable defect of the battery through an electrochemical technique such that, by pre-diagnosing a potential battery malfunction, any electrochemical failure of the vehicle battery can be identified before a problem occurs thereto, and any possible vehicle fire is prevented accordingly. In addition, defective battery detection through electrochemical spectroscopy may contribute to vehicle fire prevention. Furthermore, conditions to detect any battery failure are inspected while a car is parked and left, and an abnormal cell can thus be correctly detected through the inspection for a sufficient time.

In order to solve the above-mentioned technical problems, the present disclosure provides a battery diagnosis system including a processor configured to: receive high-voltage battery information of a car that is parked; measure impedance of a battery through the received battery information; and determine, based on a comparison between a normal battery impedance and an abnormal battery impedance, that a battery having the abnormal battery impedance is an abnormal battery.

The high-voltage battery information of the car, which is received by the processor, may include current and voltage flowing in a high-voltage battery, and temperature information of the high-voltage battery.

The processor may be configured to measure the impedance of the battery through electrochemical impedance spectroscopy.

The processor may be configured to measure the impedance of the battery for each frequency band.

The processor may be further configured to diagnose that the battery determined as the abnormal battery malfunctions, and display the malfunction-diagnosed battery through a display of the car.

The system may further include a transfer device configured to transfer normal battery and abnormal battery information when the processor determines that the battery is the abnormal battery.

The processor may be configured to measure a deterioration degree of the battery by measuring the impedance of the battery, and determine, based on the measured battery deterioration degree, that the battery having an abnormal battery deterioration degree is the abnormal battery.

The battery may include multiple cells, the processor may be configured to measure impedance of each of the battery cells, and determine, based on a comparison between a normal battery cell impedance and an abnormal battery cell impedance, that a battery cell having the abnormal battery cell impedance is an abnormal battery cell.

In order to solve the above-mentioned technical problems, the present disclosure provides a battery diagnosis method including: receiving high-voltage battery information of a car that is parked; measuring impedance of a battery through the received battery information; and determining, based on a comparison between a normal battery impedance and an abnormal battery impedance, that a battery having an abnormal battery impedance is an abnormal battery.

In the receiving of the battery information, the battery information may include current and voltage flowing in a high-voltage battery, and temperature information of the high-voltage battery.

The measuring of the impedance of the battery may include measuring the impedance of the battery through electrochemical impedance spectroscopy.

The measuring of the impedance of the battery may include measuring the impedance of the battery for each frequency band.

The method may further include, after the determining of that the battery having the abnormal battery impedance is the abnormal battery, diagnosing that the battery determined as the abnormal battery malfunctions, and displaying the malfunction-diagnosed battery through a display of the car.

The method may further include, after the determining of that the battery having the abnormal battery impedance is the abnormal battery, transferring normal battery and abnormal battery information.

According to a system and a method for diagnosing a battery according to the present disclosure, the battery of a parked vehicle is simply diagnosed by using a sensor measurement value so as to detect any undetectable defect of the battery through an electrochemical technique such that, by pre-diagnosing a potential battery malfunction, any electrochemical failure of the vehicle battery can be identified before a problem occurs thereto, and any possible vehicle fire is prevented accordingly. In addition, defective battery detection through electrochemical spectroscopy may contribute to vehicle fire prevention. Furthermore, conditions to detect any battery failure are inspected while a car is parked and left, and an abnormal cell can thus be correctly detected through the inspection for a sufficient time.

Advantageous effects obtainable from the present disclosure are not limited to the above-mentioned advantageous effects, and other advantageous effects not mentioned herein will be clearly understood by those skilled in the art to which the present disclosure pertains.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EXEMPLARY EMBODIMENTS

The particular structural or functional descriptions in the embodiments of the present disclosure, which are disclosed in the present specification or application, are merely exemplified for explanation of embodiments according to the present disclosure. Therefore, embodiments according to the present disclosure may be carried out in various forms, and should not be interpreted to be limited to the embodiments described in the present specification or application. Hereinafter, embodiments of the present disclosure will be described in detail with reference to the accompanying drawings.

Figure 1:
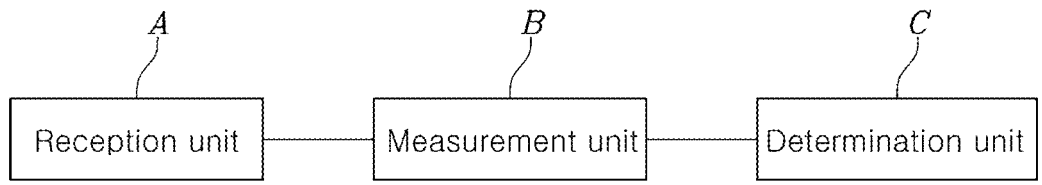
FIG. 1 is a diagram illustrating a battery diagnosis system according to an embodiment of the present disclosure.
Figure 2:
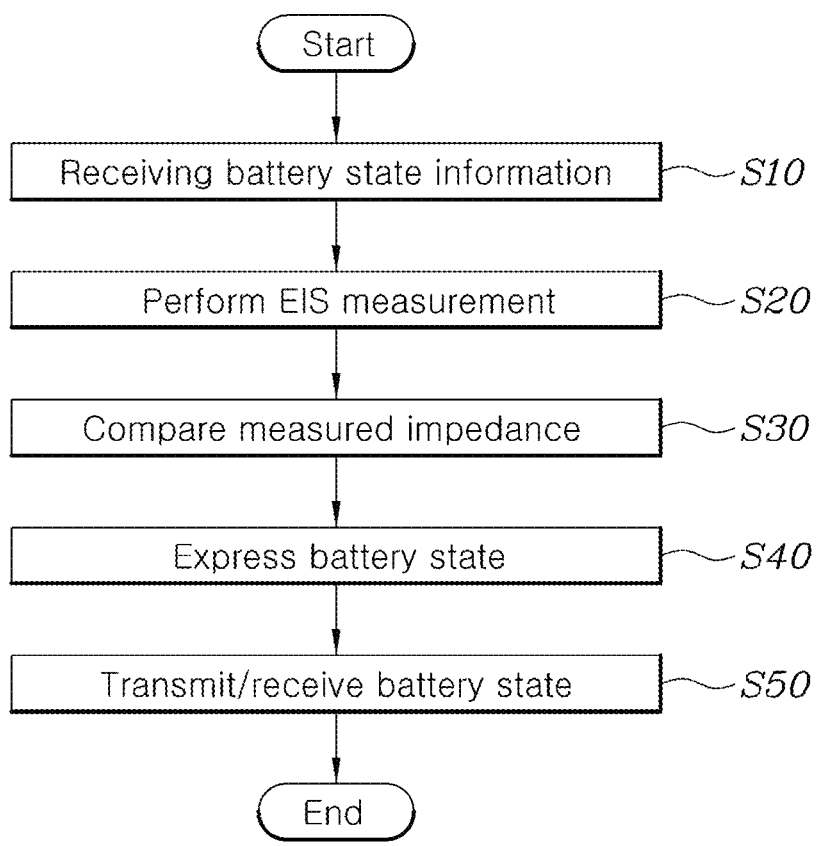
FIG. 2 is a flowchart according to which the battery diagnosis system illustrated in FIG. 1 is operated.
Figure 3:
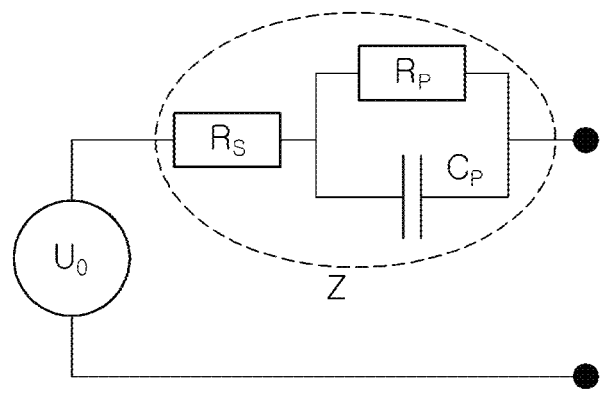
FIG. 3 is a diagram illustrating a simplified impedance model in a general battery.
Figure 4:
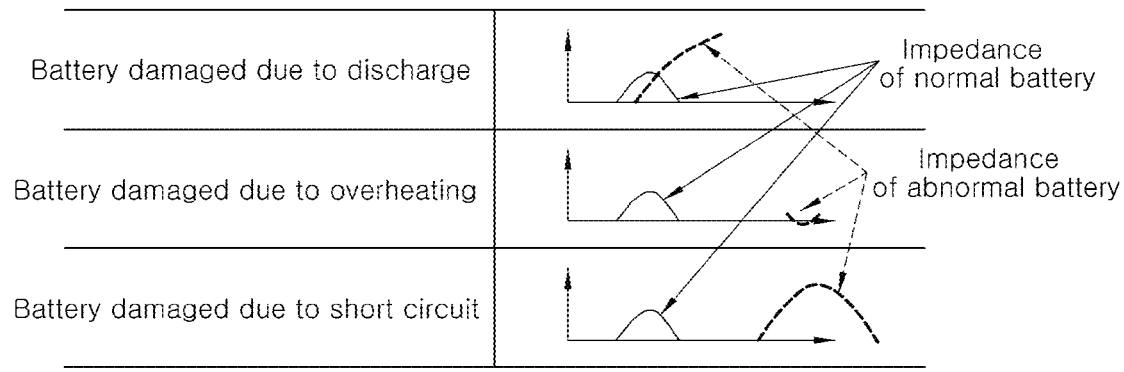
FIG. 4 is a diagram illustrating the impedance of an abnormal battery in comparison with the impedance of a normal battery.
Figure 5:
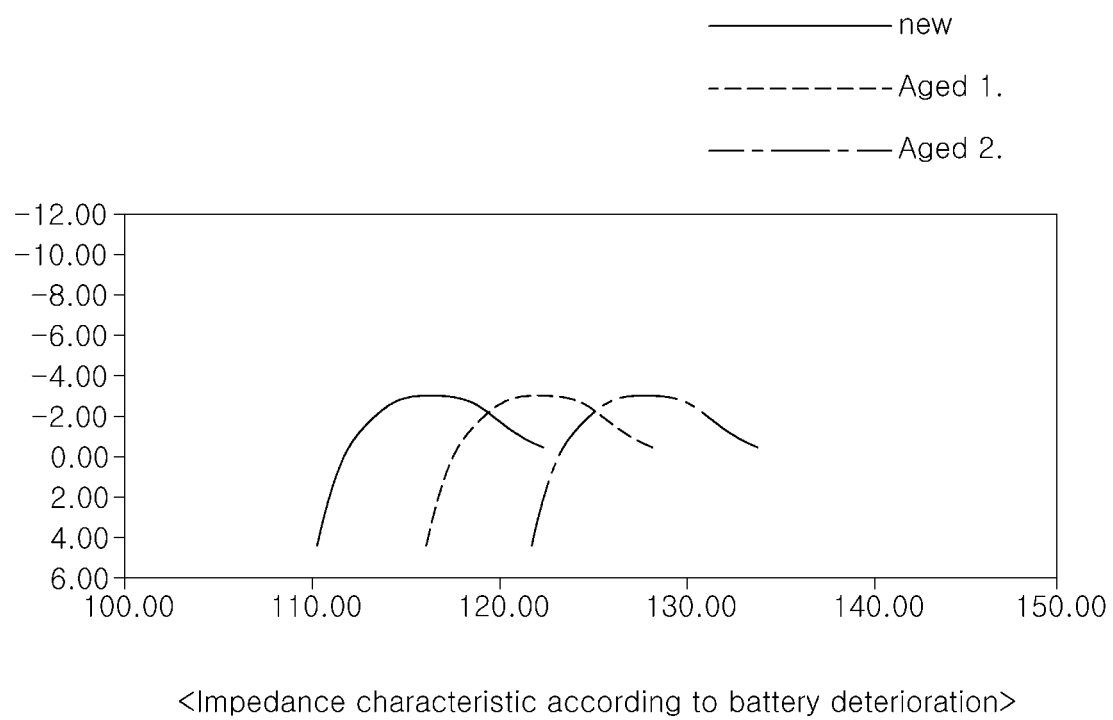
FIG. 5 is a graph showing an impedance characteristic of a battery according to a deterioration degree of the battery.

FIG. 1 is a diagram illustrating a battery diagnosis system according to an embodiment of the present disclosure. FIG. 2 is a flowchart according to which the battery diagnosis system illustrated in FIG. 1 is operated. FIG. 3 is a diagram illustrating a simplified impedance model in a general battery. FIG. 4 is a diagram illustrating the impedance of an abnormal battery in comparison with the impedance of a normal battery. FIG. 5 is a graph showing an impedance characteristic of battery according to a deterioration degree of the battery.

FIG. 1 is a diagram illustrating a battery diagnosis system according to an embodiment of the present disclosure. Referring to FIG. 1, a battery diagnosis system includes: a processor and an associated non-transitory memory storing software instructions which, when executed by the processor, provides the functionalities of a reception unit A for receiving high-voltage battery information of a parked car; a measurement unit B for measuring the impedance of a battery through the received battery information; and a determination unit C for determining, based on a comparison between a normal battery impedance and an abnormal battery impedance, that a battery having an abnormal battery impedance is an abnormal battery. The processor may take the form of one or more processor(s) and associated memory storing program instructions.

The present disclosure relates to pre-detecting of a cell having a possibility of occurrence of potential malfunction through application of electrochemical impedance spectroscopy to a battery in a situation where a car is parked. In the present disclosure, based on a comparison between a normal battery impedance and an abnormal battery impedance, a battery having an abnormal battery impedance is determined to be an abnormal battery. To this end, it is necessary to employ an electrochemical impedance spectroscopy which corresponds to a method for applying, to a cell, very small alternating current signals having different frequencies and measuring the impedance thereof. By using the electrochemical impedance spectroscopy as described above, high-voltage battery failures can be diagnosed in consideration of even actual specific internal characteristics of a battery.

A high-voltage battery failure diagnosis system generally detects the defects of a high-voltage battery by using the insulation resistance and the cell voltage difference of a high-voltage battery system in a non-load state. In such a high-voltage battery diagnosis system, values and conditions configured for failure diagnosis of a high-voltage battery are not enough to detect a defect which may be fatal to the system, and there is a problem in that battery characteristics (current/voltage/temperature), which are measured in the battery diagnosis system, alone fail to reflect even an actual specific internal characteristic of the battery. Therefore, it is required to reflect even an actual specific internal characteristic of the battery to determine whether the battery has a defect, so as to pre-diagnose the malfunction of the battery.

However, battery characteristics (current/voltage/temperature) that are measured in the battery diagnosis system do not include specific internal characteristics of the battery. Therefore, a method for detecting a characteristic including a specific internal characteristic of a battery should be considered. Battery impedance may also be referred to as battery internal resistance. As battery impedance increases, the deterioration degree of the battery increases. As the deterioration degree of a battery increases, the life of the battery is reduced. If the internal resistance becomes large, a voltage drop becomes also large due to the internal resistance, and thus even when the battery is charged with electricity, the battery is unable to supply sufficient power to a load. Therefore, a method for diagnosing the failure of a high-voltage battery is required to be found. An impedance measurement, that is, an electrical impedance spectroscopy (EIS) scheme, is used for diagnosis of a battery state as the method for detecting a characteristic including a specific internal characteristic of a battery. In a method for diagnosing the failure of a high-voltage battery by using the electrical impedance spectroscopy (EIS) scheme, a charge state and a health state of a battery can be easily determined by using an impedance characteristic which changes according to a battery state for each frequency. Impedance is interpreted as a cause of interruption of electricity transfer when a chemical (oxidation-reduction) reaction occurs in an electrode, and impedance spectroscopy is used in order to precisely and rapidly perform battery analysis. Rs indicates the Ohm resistance of the inside (electrode and electrolyte) of a battery, and dominantly affects battery characteristics as a voltage/current change period is larger. Therefore, Rs is also called AC resistance, and as the performance of a battery degrades due to battery aging, the Rs value increases. Accordingly, Rs is a criterion of determining a battery life. Therefore, a method, in which a battery of a parked car is diagnosed through simple sensor measurement values so that a defect of the battery, which has been unable to be detected, is detected through an electrochemical scheme so as to pre-diagnose potential malfunction of the battery and check whether there is an electrochemical failure of the battery before a problem occurs in the car battery, is applied to prevent a problem of transition to a car fire. In addition, detection of a defective battery through electrochemical spectroscopy can assist in prevention of car fires. Furthermore, a condition to detect whether there is a failure of a battery is inspected in a state where a car is parked and left, and thus an abnormal cell can be correctly detected through the inspection performed for a sufficient time.

Specifically, a high-voltage battery diagnosis system using impedance spectroscopy can maximize a battery life through battery diagnosis, and can recognize a precise charge state of the battery, and thus can precisely predict the mileage or usage time of the battery. In addition, the residual life of the battery can be predicted even while the battery is being used. Eventually, the battery can be utilized in a charging scheme optimized for the state of the battery. The reception unit A may receive high-voltage battery information of a parked car, and the measurement unit B measures the impedance of a battery through the received battery information. The reception unit A receives, as the battery information, the voltage of the battery, the current of the battery, and temperature information of the battery, and the received voltage of the battery, the received current of the battery, and the received temperature information of the battery may be used to acquire the impedance of the battery by using a voltage value measured for each frequency band during diagnosis of the high-voltage battery through impedance spectroscopy. The measurement unit B may use pieces of information received from the reception unit A to measure the impedance of each cell of the high-voltage battery while changing a frequency band, and store information of the measured impedance of each cell. The determination unit C determines, based on a comparison between a normal battery impedance and an abnormal battery impedance, that a battery having an abnormal battery impedance is an abnormal battery. The abnormality determination unit may identify cell information having abnormal impedance information through a comparison between the measured impedance information of each cell and impedance information of a normal state battery, identify the type of the abnormal impedance, and identify malfunction information, so as to use the pieces of information for malfunction diagnosis.

If a conventional battery diagnosis system is used, there is a problem in that the system is not enough to detect a defect which may incur a fatal problem in a battery, and battery characteristics, which are measured in the battery diagnosis system, alone fail to reflect an actual specific internal characteristic of the battery. Therefore, a method using electrochemical characteristics, such as electrochemical impedance spectroscopy, is used to diagnose the failure of the high-voltage battery through reflection of even actual specific internal characteristics of the battery.

The high-voltage battery information of the car, which is received by the reception unit A, may include the current and voltage flowing in the high-voltage battery, and temperature information of the high-voltage battery.

Information of the current and voltage flowing in the high-voltage battery, and the temperature information of the high-voltage battery means the information of the battery, and is required for the measurement unit B to use pieces of information received from the reception unit A to measure the impedance of each cell of the high-voltage battery while changing a frequency band, and store information of the measured impedance of each cell.

FIG. 3 is a diagram illustrating a simplified impedance model in a general battery.

Referring to FIG. 3, the measurement unit B may measure the impedance of a battery through electrochemical impedance spectroscopy. The impedance spectroscopy is used in order to precisely and rapidly perform battery analysis, and a method, in which a battery of a parked car is diagnosed through simple sensor measurement values so that a defect of the battery, which has been unable to be detected, is detected through an electrochemical scheme so as to pre-diagnose potential malfunction of the battery and check whether there is an electrochemical failure of the battery before a problem occurs in the car battery, is applied. Generally, batteries have complex and non-linear characteristics, and thus the simplified impedance model as illustrated in FIG. 3 is used to substantially analyze a battery. Referring to FIG. 3, Z indicates the total impedance of a battery, and is divided into a real number and an imaginary number. Rs indicates the Ohm resistance of the inside (electrode and electrolyte) of the battery, and dominantly affects battery characteristics as a voltage/current change period is larger. Therefore, Rs is also called AC resistance. As the performance of a battery degrades due to battery aging, the Rs value increases. Accordingly, Rs is a criterion of determining a battery SOH. In a case of lithium ion batteries, Rs is detected at around about 1 kHz.

The measurement unit B measures the impedance of a battery for each frequency band.

An apparatus for impedance analysis depending on frequency provides a basis for rapid evaluation of a battery state. An AC characteristic measured at a frequency of about 1 kHz is used to evaluate the aging state of a battery, and a DC characteristic measured at a low frequency (about 1 Hz) is used to determine the charge state of a battery. Therefore, through measurement of the impedance of a battery for each frequency band, the malfunction of the battery can be pre-diagnosed rapidly and precisely, and whether there is an electrochemical failure of the battery can be checked before a problem occurs in the car battery.

The system may further include a display unit which diagnoses that the battery determined as the abnormal battery, which is determined by the determination unit C, malfunctions, and displays the malfunction-diagnosed battery through a display of the car.

The display unit displays malfunction diagnosis information on a cluster or an AVN, based on a malfunction type. The AVN indicates an infotainment system of a car, and the infotainment system is simply called AVN (which means audio, video, and navigation) in Korea. The role of AVNs has been gradually enlarged, and AVNs act as a multimedia device which handles audio, video, and navigation. When the determination unit C determines, based on a comparison between a normal battery impedance and an abnormal battery impedance, that a battery having an abnormal battery impedance is an abnormal battery, the display unit may diagnose that the battery determined as the abnormal battery, which is determined by the determination unit C, malfunctions, and display the malfunction-diagnosed battery through a display of the car (e.g., a cluster, an AVN, etc.) so as to pre-diagnose potential malfunction of the battery and check whether there is an electrochemical failure of the battery before a problem occurs in the car battery. In addition, in a case where the display unit diagnoses that the abnormal battery malfunctions, the display unit may transmit malfunction information of the battery to a central computing system so as to allow the information to be transferred to the user so that the user can be informed by a text or call notification.

The system may further include a transfer device which transfers normal battery and abnormal battery information when the determination unit C determines that a battery is an abnormal battery.

The display unit displays malfunction diagnosis information on a cluster or an AVN, based on a malfunction type, and transmits malfunction information of the battery to the central computing system so as to allow the information to be transferred to the user so that the user can be informed by a text or call notification. The transfer device transfers data determined by the determination unit C or the normal battery and abnormal battery information displayed by the display unit.

The transfer device may be a hardware device implemented by various electronic circuits, e.g., processor(s), to transmit and receive signals via wireless or wired connections.

FIG. 4 is a diagram illustrating the impedance of an abnormal battery in comparison with the impedance of a normal battery. FIG. 5 is a graph showing an impedance characteristic of a battery according to a deterioration degree of the battery. Referring to FIG. 4, it can be shown that, as the battery ages, the impedance of the battery increases and thus the Rs value of the battery increases in the right direction.

The measurement unit B measures the impedance of a battery to measure a deterioration degree of the battery, and the determination unit C determines, based on the measured battery deterioration degree, that a battery having an abnormal battery deterioration degree is an abnormal battery.

A battery life is referred to as a state of health (SOH), and can be determined through how much charge amount is maintained compared to an initial charge amount. The impedance of a battery increases over use of the battery. When the impedance of a battery increases, a deterioration degree of the battery also increases. Furthermore, when the deterioration degree of the battery increases, the life of the battery is reduced, and if the internal resistance becomes large, a voltage drop becomes also large due to the internal resistance, and thus even when the battery is charged with electricity, the battery is unable to supply sufficient power to a load. Therefore, through this principle, the determination unit C can determine, based on a measured battery deterioration degree, that a battery having an abnormal battery deterioration degree is an abnormal battery. As illustrated in FIG. 4, from the top of the diagram, the impedance of a battery damaged due to discharge, a battery damaged due to overheating, and a battery damaged due to a short circuit is positioned on the right of the impedance of a normal battery.

Through this diagram, it can be noted that whatever the shapes of the impedance graph lines of a battery damaged due to discharge, a battery damaged due to overheating, and a battery damaged due to a short circuit, the impedance of an abnormal battery is larger than that of a normal battery. Therefore, an abnormal battery is distinguished from a normal battery and, particularly, an internal short circuit of a battery (a battery damaged due to a short circuit) may be directly related to the fire of the battery. Therefore, it can be noted that detection of a defective battery through electrochemical spectroscopy can assist in prevention of car fires. Furthermore, referring to FIG. 5, in addition to the detection of an abnormal battery, the SOH of the battery may be identified by using an impedance characteristic which changes according to an aged degree of the battery. As described above, a deterioration degree may be determined through inspection of change in the Rs value. In addition, it can be noted that, as the deterioration of the battery progresses, the Rs value increases in the right direction.

The battery may include multiple cells. The measurement unit B may measure the impedance of each of the battery cells, and the determination unit C may determine, based on a comparison between a normal battery cell impedance and an abnormal battery cell impedance, that a battery cell having an abnormal battery cell impedance is an abnormal battery cell.

Generally, an electric car battery includes a battery cell, a battery module, and a battery pack, and many battery cells are mounted in an electric car through the types of a module and a pack in order to safely and efficiently manage the battery cells. A module is made of a bundle of several battery cells, and a pack is made of a bundle of several modules, and finally, a battery in a single pack type is received in an electric car. A battery cell indicates a basic unit of a lithium ion battery which can be used through charging or discharging of electric energy. The electrochemical impedance spectroscopy, which is used in the present disclosure, corresponds to a method for applying, to a cell, very small alternating current signals having different frequencies and measuring the impedance thereof. Therefore, by using a method using an electrochemical characteristic, such as the electrochemical impedance spectroscopy as described above, a high-voltage battery failure can be diagnosed in consideration of even actual specific internal characteristics of a battery.

FIG. 2 is a flowchart according to which the battery diagnosis system illustrated in FIG. 1 is operated.

Referring to FIG. 2, a battery diagnosis method includes: receiving high-voltage battery information of a parked car (S10); measuring the impedance of a battery through the received battery information (S20); and, based on a comparison between a normal battery impedance and an abnormal battery impedance (S30), determining that a battery having an abnormal battery impedance is an abnormal battery (S40).

Specific technical features in each of the operations of the battery diagnosis method according to the present disclosure are the same as or similar to the technical features of each of the elements of the battery diagnosis system according to the present disclosure, as described above. Therefore, a detailed description therefor will be omitted.

In the receiving of the battery information (S10), the battery information may include the current and voltage flowing in a high-voltage battery, and temperature information of the high-voltage battery.

In the measuring of the impedance of the battery (S20), the impedance of the battery may be measured through electrochemical impedance spectroscopy.

In the measuring of the impedance of the battery (S20), the impedance of the battery may be measured for each frequency band.

The method may further include, after the determining of that the battery having the abnormal battery impedance is the abnormal battery (S40), diagnosing that the battery determined as the abnormal battery malfunctions, and displaying the malfunction-diagnosed battery through the car.

The method may further include, after the determining of that the battery having the abnormal battery impedance is the abnormal battery (S40), transferring normal battery and abnormal battery information (S50).

As described above, a particular embodiment of the present disclosure has been illustrated and described, but various changes and modifications would be obvious to a person ordinarily skilled in the art without departing from the technical idea of the present disclosure, provided by the following claims.

What is claimed is:

1. A battery diagnosis system comprising a processor configured to:
   receive battery information of a battery of a car that is parked, the battery comprising multiple battery cells;
   measure impedance of each of the battery cells of the battery through the received battery information, wherein alternating current signals having different frequencies are applied to each of the battery cells of the battery;
   determine, based on a comparison between impedance of a normal battery cell of the battery and impedance of an abnormal battery cell of the battery, that a battery cell having the impedance of the abnormal battery cell among the battery cells of the battery is the abnormal battery cell; and
   a transfer device configured to transfer normal battery and abnormal battery information when the processor determines that the battery is an abnormal battery,
   wherein the transfer device is configured to transfer malfunction diagnosis information of the battery based on a malfunction type,
   wherein the processor is further configured to identify a type of a battery damage cause based on the comparison between the impedance of the normal battery cell and the impedance of the abnormal battery cell and a shape of a total impedance graph of the abnormal battery cell.

2. The system of claim 1, wherein the battery information of the car, which is received by the processor, comprises current and voltage flowing in the battery, and temperature information of the battery.

3. The system of claim 1, wherein the processor is configured to measure the impedance of each of the battery cells through electrochemical impedance spectroscopy.

4. The system of claim 3, wherein the processor is configured to measure the impedance of each of the battery cells for each of a plurality of frequency bands.

5. The system of claim 1, wherein the processor is further configured to diagnose that the battery malfunctions, and display an indication of the malfunctioned battery through a display of the car.

6. The system of claim 1, wherein the impedance of each of the battery cells is comprised of a real number and an imaginary number, which defines a shape of a total impedance graph of a corresponding battery cell.

7. The system of claim 1, wherein the processor is configured to:
   measure a deterioration degree of the battery by measuring the impedance of the battery, and
   determine, based on the measured battery deterioration degree, that the battery having an abnormal battery deterioration degree is the abnormal battery.

8. A battery diagnosis method comprising steps of:
   receiving battery information of a battery of a car that is parked, the battery comprising multiple battery cells;
   applying alternating current signals having different frequencies to each of the battery cells of the battery;
   measuring impedance of each of the battery cells through the received battery information;
   determining, based on a comparison between impedance of a normal battery cell of the battery and impedance of an abnormal battery cell of the battery, that a battery cell having the impedance of the abnormal battery cell among the battery cells of the battery is the abnormal battery cell; and
   after the step of determining that a battery cell having the impedance of the abnormal battery cell among the battery cells of the battery is the abnormal battery cell, transferring normal battery and abnormal battery information,
   wherein the step of transferring normal battery and abnormal battery information comprises transferring malfunction diagnosis information of the battery based on a malfunction type, and
   wherein a type of a battery damage cause is identified based on the comparison between the impedance of the normal battery cell and the impedance of the abnormal battery cell and a shape of a total impedance graph of the abnormal battery cell.

9. The method of claim 8, wherein, in the step of receiving battery information, the battery information comprises current and voltage flowing in the battery, and temperature information of the battery.

10. The method of claim 9, wherein the step of measuring impedance of each of the battery cells comprises measuring the impedance of each of the battery cells for each of a plurality of frequency bands.

11. The method of claim 8, wherein the step of measuring impedance of each of the battery cells comprises measuring the impedance of each of the battery cells through electrochemical impedance spectroscopy.

12. The method of claim 8, wherein the impedance of each of the battery cells is comprised of a real number and an imaginary number, which defines a shape of a total impedance graph of a corresponding battery cell.

13. The method of claim 8, further comprising steps of, after the step of determining that a battery cell having the impedance of the abnormal battery cell among the battery cells of the battery is the abnormal battery cell, diagnosing that the battery malfunctions, and displaying an indication of the malfunctioned battery through a display of the car.

* * * * *